United States Patent [19]

Gross et al.

[11] Patent Number: 5,789,810
[45] Date of Patent: Aug. 4, 1998

[54] SEMICONDUCTOR CAP

[75] Inventors: Larry D. Gross, Poughkeepsie, N.Y.; Richard W. Cadovius, Cowansville, Canada

[73] Assignee: International Business Machines Corporation, Armonk, N.Y.

[21] Appl. No.: 576,104

[22] Filed: Dec. 21, 1995

[51] Int. Cl.$^6$ .................. H01L 23/12; H01L 23/48
[52] U.S. Cl. ............ 257/704; 257/697; 257/710; 437/221; 72/359; 72/379.2
[58] Field of Search .................. 257/704, 708, 257/710, 697, 780; 72/359, 329.2; 437/221

[56] References Cited

U.S. PATENT DOCUMENTS

| | | | |
|---|---|---|---|
| 3,962,899 | 6/1976 | Hubbell | 72/334 |
| 4,113,522 | 9/1978 | Hamilton et al. | 148/11.5 |
| 4,145,903 | 3/1979 | Leach et al. | 72/60 |
| 4,177,665 | 12/1979 | Schurmann | 72/359 |
| 5,023,398 | 6/1991 | Mahulikar et al. | 257/708 |
| 5,233,225 | 8/1993 | Ishida et al. | 257/775 |
| 5,397,917 | 3/1995 | Ommen et al. | 257/700 |
| 5,455,457 | 10/1995 | Kurokawa | 257/710 |

OTHER PUBLICATIONS

Taylor Lyman, Metals Handbook, Apr. 1960, pp. 33–45.

*Primary Examiner*—Sara W. Crane
*Assistant Examiner*—David Ostrowski
*Attorney, Agent, or Firm*—Steven J. Soucar

[57] ABSTRACT

A method for manufacturing a cap for use in a semiconductor package is disclosed. The semiconductor package includes a semiconductor chip and a substrate. The chip is mounted with the substrate at a chip locus. The method preferably comprises the steps of placing a slug in a die, and exercising the die to cold flow the slug to a predetermined cap configuration. The cap configuration includes a plurality of walls depending from a polygonal generally planar base and cooperating with the base to establish a well bounded by the walls and the base. The walls terminate in a plane, and the well clears the chip when the cap is mounted on the substrate at the chip locus. The invention further includes a cap for use in a semiconductor package. The cap comprises a structure cold flowed from a slug in a die to a predetermined cap configuration. The cap configuration includes a plurality of walls depending from a polygonal generally planar base and cooperates with the polygonal base to establish a well bounded by the plurality of walls and the polygonal base. The walls terminate generally in a termination plane, and the well clears the chip when the cap is abuttingly mounted at the termination plane on the substrate at the chip locus.

9 Claims, 2 Drawing Sheets

SEMICONDUCTOR CAP

BACKGROUND OF THE INVENTION

The present invention is directed to an improved method for manufacturing a cap for use in a semiconductor package, and to an improved such cap.

In semiconductor packaging technology today there are two principal arrangements for connecting a semiconductor chip with a substrate: wire bond connection and C4 (Controlled Collapse Chip Connection) connection.

In the case of wire bond connection, a chip is situated in abutting relation with a substrate, within a well structure provided to receive the chip and to present connection loci for electrically coupling the chip input-output (IO) contacts with connection loci on the substrate. Usually the connection loci are also situated within the well structure. In this wire bond connection packaging scheme, the electrical couplings between the chip IO contacts and the connection loci of the substrate are effected by very fine wire connections. A flat cap is then affixed spanning the well containing the chip and its wire bond connections in order to protect the delicate connections from physical or electrical disturbance. As the size of semiconductor packages has shrunk, the wire connections necessarily have become finer, more difficult to handle by either automated or manual processing, and more prone to failure or misapplication.

An alternative to wire bonding connection which avoids at least some of the shortcomings of that packaging technology is the C4 connection technology. This C4 connection technology establishes solder balls at chip IO contacts, and establishes contact pad lands, or areas, for electrical connection with the substrate. No well need be provided for reception and mounting of the chip to the substrate. The chip is urged against the generally planar substrate with chip IO solder balls in mating contact with substrate contact pad lands appropriately to reflow the solder balls and at least partially collapse the solder balls to establish electrical contact between the chip and the substrate. This urging operation is usually conducted under some predetermined pressure and heat. After electrical connection is thus effected using C4 technology, a cap is placed over the chip, in a generally nestling relationship with respect to the chip, to physically and electrically protect the chip and the chip-to-substrate connection.

In both the wire bond connection and the C4 bond connection structures, the caps are preferably made of metal in order to dissipate heat generated by the chip. Depending upon the particular application, especially when little heat needs to be dissipated, caps may be manufactured of a material other than metal, such as plastic or ceramic.

Prior art methods for manufacturing such caps appropriate for C4 connection techniques have been manufactured by methods such as stamping a cap pattern from a sheet of metal and drawing the pattern to yield a finished cap. Another prior art method for manufacturing semiconductor packaging caps is by blanking a three-dimensional blank form for a cap and machining the blank form to a final cap configuration. Yet another prior art manufacturing method for semiconductor packaging caps has been machining a finished cap without preliminary blank formation. All of these manufacturing methods suffer from common shortcomings: they are expensive to implement, they are not readily automated high-volume production level manufacturing, and they are very expensive. By way of example, in production quantities, C4 packaging caps are known to cost in excess of $2.00 each, and sometimes in excess of $3.00 each, depending upon the prior art manufacturing method employed in their fabrication. Such high manufacturing costs (especially in view of the further fact that many computer or computer-controlled systems employ numerous chip-to-substrate connections and associated caps) are a worthy point of attack for cost reduction.

There is a need for an improved semiconductor packaging cap, especially such a cap appropriate for C4 connection technology, which is less expensive to manufacture than prior art semiconductor packaging caps.

SUMMARY OF THE INVENTION

The invention is a method for manufacturing a cap for use in a semiconductor package. The semiconductor package includes a semiconductor chip and a substrate. The chip is mounted with the substrate at a chip locus. The method preferably comprises the steps of placing a slug in a die; and exercising the die to cold flow the slug to a predetermined cap configuration. The cap configuration includes a plurality of walls depending from a polygonal generally planar base and cooperating with the polygonal base to establish a well bounded by the plurality of walls and the polygonal base. The walls terminate generally in a termination plane, and the well clears the chip when the cap is abuttingly mounted at the termination plane on the substrate at the chip locus.

The invention further contemplates and includes a cap for use in a semiconductor package. The semiconductor package includes a semiconductor chip and a substrate, and the chip is mounted with the substrate at a chip locus. The cap comprises a structure cold flowed from a slug in a die to a predetermined cap configuration. The cap configuration includes a plurality of walls depending from a polygonal generally planar base and cooperates with the polygonal base to establish a well bounded by the plurality of walls and the polygonal base. The walls terminate generally in a termination plane, and the well clears the chip when the cap is abuttingly mounted at the termination plane on the substrate at the chip locus. Preferably, the slug contains aluminum or is a metal alloy containing aluminum. Also preferably, the cold flowing is effected as a coining operation.

It is, therefore, an object of the present invention to provide a method for manufacturing a cap for use in a semiconductor package which is inexpensive to use.

It is also an object of the present invention to provide a cap for use in a semiconductor package which is inexpensive to manufacture.

Further objects and features of the present invention will be apparent from the following specification and claims when considered in connection with the accompanying drawings illustrating the preferred embodiment of the invention.

DETAILED DESCRIPTION OF THE INVENTION

Figure 1:
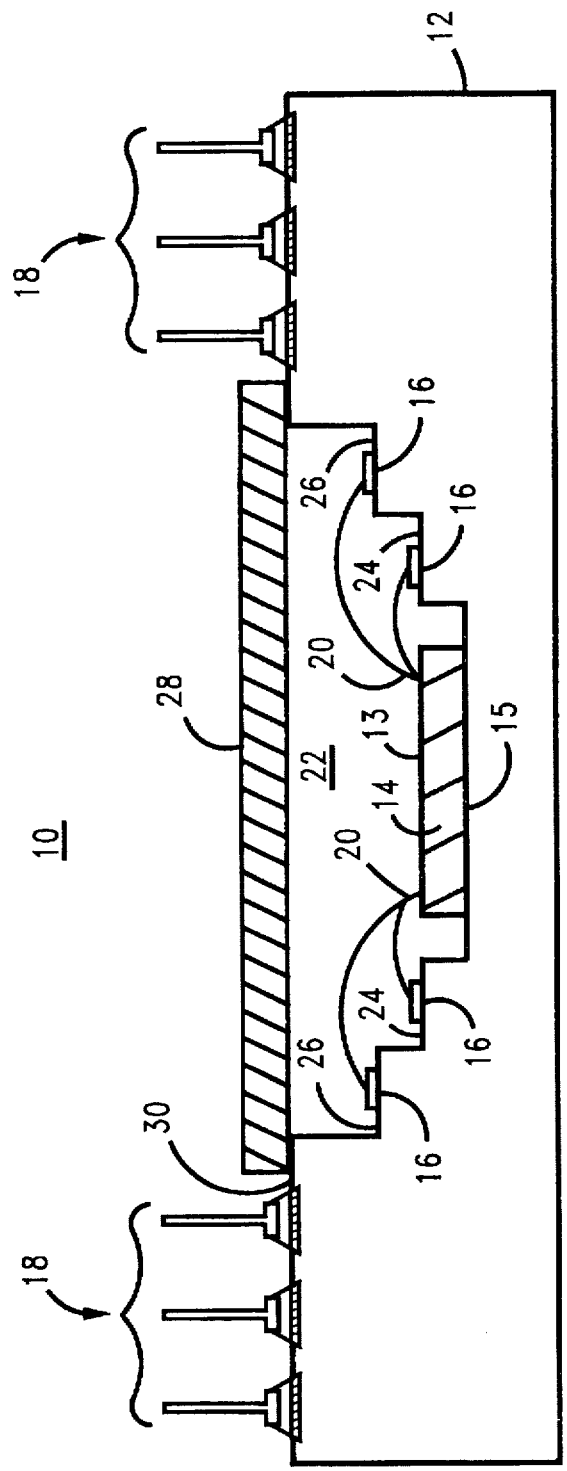
FIG. 1 is a schematic partial section side elevation view of a semiconductor package employing wire bond connection technology.

FIG. 1 is a schematic partial section side elevation view of a semiconductor package employing wire bond connection technology. In FIG. 1, a semiconductor package 10 includes a substrate 12 and a chip 14. Substrate 12 may be a semiconductor module containing internal circuit paths or electrical components; substrate 12 also includes a plurality of connection loci 16. Each connection locus 16 is coupled with an internal component or circuit path within substrate 12 (not shown in FIG. 1); at least some of connection loci 16 are electrically coupled through substrate 12 with input-output (IO) pins 18. Chip 14 has a plurality of chip IO contacts (not shown in detail in FIG. 1) are arrayed on chip IO side 13. The plurality of chip IO contacts are coupled with selected connection loci 16 by wire connectors 20. Substrate 12 has a well 22 with stepped plateaus 24, 26 surrounding well 22. Connection loci 16 are arrayed on stepped plateaus 24, 26 enabling clearance intermediate respective neighboring connection loci 16 to facilitate connection of wire connectors 20. Chip 14 is fixed directly to substrate 12 in well 22 by its side 15 opposite chip IO side 13. Such affixation is effected by conventional means, such as by adhesive (not shown in FIG. 1).

A cap 28, preferably of a metallic material to facilitate heat dissipation and to provide durability and security, is affixed in spanning position over well 22 and in abutting contact with IO face 30 of substrate 12. Cap 28 is generally planar in FIG. 1. Cap 28 may have other shapes. However, a planar shape is possible for cap 28 in a wire bond connection structure such as illustrated in FIG. 1 because well 22 provides sufficient clearance above chip 14 to accommodate such a planar shape.

Figure 2:
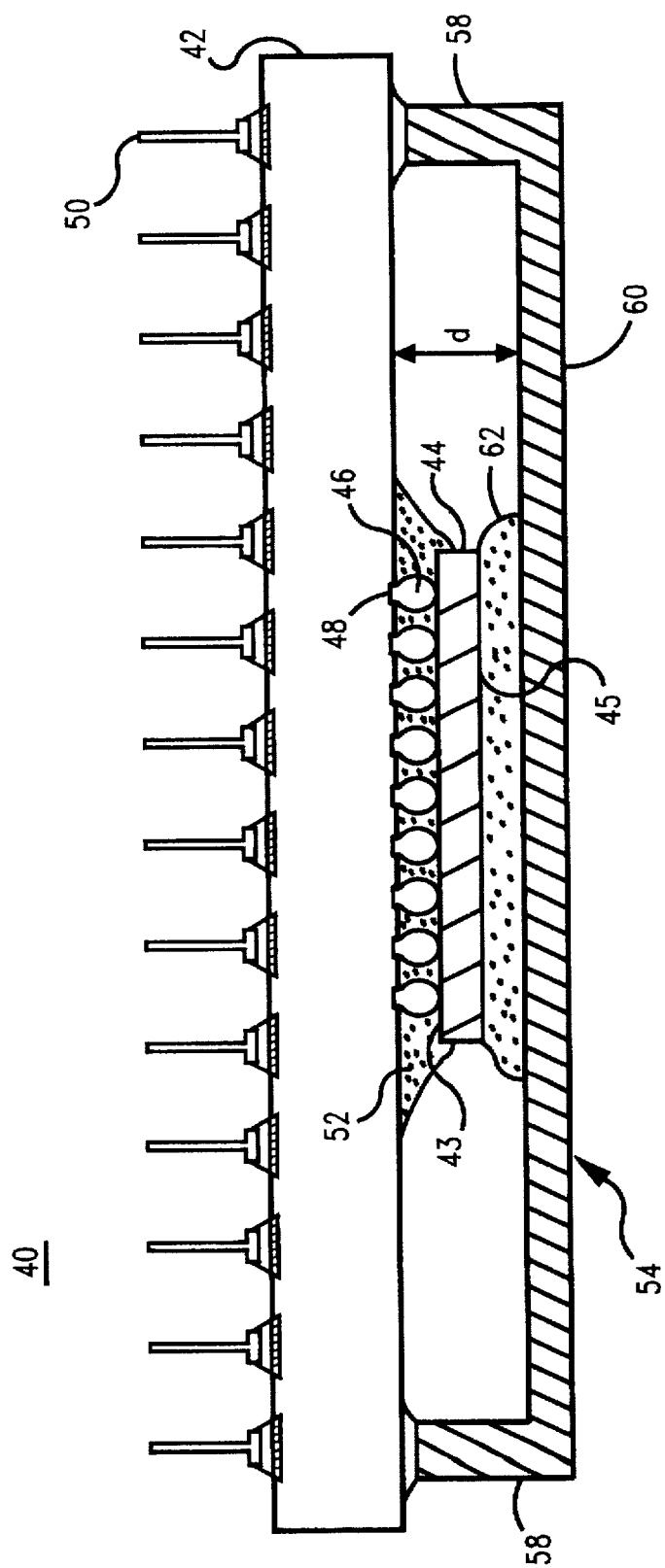
FIG. 2 is a schematic partial section side elevation view of a semiconductor package employing controlled collapse chip connection (C4) technology.

FIG. 2 is a schematic partial section side elevation view of a semiconductor package employing controlled collapse chip connection (C4) technology. In FIG. 2, a semiconductor package to 40 includes a substrate 42 and a chip 44. Chip 44 is provided with a plurality of solder balls 46; solder balls 46 are coupled with connection loci 48 on substrate 42. Each connection locus 48 is coupled with an internal component or circuit path within substrate 42 (not shown in FIG. 2); at least some of connection loci 48 are electrically coupled through substrate 42 with input-output (IO) pins 50 arrayed on a first face 51 of substrate 42. Chip 44 has a plurality of chip IO contacts (not shown in detail in FIG. 2) are arrayed on chip IO side 43. The plurality of chip IO contacts are coupled with selected connection loci 48 by solder balls 46. Additional affixing material 52, which is electrically non-conductive so as to not short solder balls 46 and other electrical contacts, is employed to strengthen the bond between chip 44 and substrate 42.

A cap 54 is configured to establish a plurality of walls 58 depending from a polygonal substantially planar base 60 a distance "d". The walls 58 are substantially perpendicular to the base 60. Distance "d" is a sufficient distance to allow base 60 to clear chip 44. Distance "d" should also preferably be appropriate to facilitate accommodating a heat transmitting material 62 intermediate base 60 and chip side 45. Since chip 44 is affixed with substrate by chip IO side 43, chip side 45 is exposed and clear for heat dissipation. By coupling cap 54 with chip side 45 using heat transmitting material 62, cap 54 may be employed as a heat sink or heat dissipator structure to enhance cooling of chip 44 during operation. It is for such practical reasons that cap 54 is preferably configured of a metallic material, in order to enhance heat dissipation. Further, it is important that the thermal coefficient of expansion for cap 54 and substrate 42 be as similar as possible in order that thermal cycling will not break the bond between cap 54 and substrate. The bond between cap 54 and substrate 42 is usually established by an adhesive material.

Prior art caps, such as cap 54, used for C4-type semiconductor packages have generally heretofore been manufactured by either (1) blanking the cap material to generally shape the material to approximate walls 58, base 60, and distance "d", and then machining the blank thus formed to a final cap 54; or (2) machining a cap 54 from a block of metallic material without preliminary shaping. Such manufacturing methods do not accommodate fast, repeatable, reliable, and inexpensive production of caps. Blanked and machined caps (in quantities of 500 thousand) are known to cost $2.50 per cap. Machined caps, with no preliminary shaping, are known to cost $3.25 per cap in quantities of 500 thousand.

Some prior art caps are also manufactured by stamping a blank out of sheet metal and drawing the blank in a drawing die to establish a cap 54. This manufacturing method is cheaper than the above described machining manufacturing methods, but the resultant cap is too thin (owing to the requirement of thinness for stamping) to provide adequate heat sinking for modern high speed chips, such as microprocessors.

Cap 54 is preferably produced using a coining manufacturing process. Coining is a method of cold forming metal by compression. Coining is known to impart smooth finishes and close tolerances, and is known to sometimes be more economical than production of a similar finish using cutting tools. Other objects are generally known to be efficiently produced by coining such as connecting rods for gasoline engines. However, no instance of manufacturing semiconductor caps is known or has been suggested. Coined caps have been estimated to cost $0.65 per cap in quantities of 500 thousand. The tooling, in the form of dies, for coining is more expensive than the tooling for the machining operations described above. It is for this reason that coining has not been suggested as a manufacturing method for semiconductor caps. Tooling for machining operations is approximately two thousand to five thousand dollars. Tooling for coining operations is in excess of twenty thousand dollars. It is only when production volumes of caps are very high that the advantages of coining are apparent.

It is to be understood that, while the detailed drawings and specific examples given describe preferred embodiments of the invention, they are for the purpose of illustration only, that the structure and method of the invention are not limited to the precise details and conditions disclosed, and that various changes may be made therein without departing from the spirit of the invention which is defined by the following claims.

We claim:

1. A method for manufacturing a cap for use in a semiconductor package; said semiconductor package including a semiconductor chip and a substrate; said chip being mounted with said substrate; the method comprising the steps of:

placing a slug in a die;

exercising said die to cold flow said slug to a predetermined cap configuration said cap configuration including a plurality of walls depending from a polygonal generally planar base and cooperating with said polygonal base to establish a well bounded by said plurality of walls and said polygonal base; said plurality of walls terminating generally in a termination plane; said well clearing said chip when said cap is abuttingly mounted at said termination plane on said substrate, where said exercising is effected as a coining operation.

2. A method for manufacturing a cap for use in a semiconductor package as recited in claim 1 wherein said slug contains aluminum.

3. A method for manufacturing a cap for use in a semiconductor package as recited in claim 1 wherein said slug is a metal alloy containing aluminum.

4. A method for manufacturing a cap for use in a semiconductor package, said semiconductor package including a semiconductor chip and a substrate, said chip being mounted to said substrate by controlled collapse chip connection; the method comprising the steps of:

(a) placing a slug in a die;

(b) exercising said die to cold flow said slug to a predetermined cap configuration; said cap configuration including a plurality of walls depending from a generally planar base and cooperating with said base to establish a well bounded by said plurality of walls terminating generally in a termination plane; said plurality of walls extending a distance to permit clearing of the chip by the cap when said cap is abuttingly mounted at said termination plane on a substrate to which said chip is mounted, said exercising is effected as a coining operation.

5. A method for manufacturing a cap for use in a semiconductor package as recited in claim 4 wherein said slug contains aluminum.

6. A method for manufacturing a cap for use in a semiconductor package as recited in claim 4 wherein said slug is a metal alloy containing aluminum.

7. A method for manufacturing a cap for use in a semiconductor package as recited in claim 4 wherein said plurality of walls are substantially perpendicular to said base.

8. A method for manufacturing a cap for use in a semiconductor package as recited in claim 4 wherein said plurality of walls extend a distance to facilitate placement of a heat transmitting material intermediate said base and a chip to couple said base and said chip.

9. A semiconductor package having a cap made in accordance with claim 4.

* * * * *